United States Patent
Reyes et al.

[11] Patent Number: 5,945,694
[45] Date of Patent: Aug. 31, 1999

[54] COMPOUND SEMICONDUCTOR DEVICE HAVING REDUCED TEMPERATURE VARIABILITY

[75] Inventors: Adolfo C. Reyes, Tempe; Marino J. Martinez, Phoenix; Mark R. Wilson, Mesa; Julio C. Costa; Ernest Schirmann, both of Phoenix, all of Ariz.

[73] Assignee: Motorola, Inc., Schaumburg, Ill.

[21] Appl. No.: 08/792,606

[22] Filed: Jan. 31, 1997

[51] Int. Cl.⁶ .................. H01L 31/0328; H01L 31/0336; H01L 31/072; H01L 31/109

[52] U.S. Cl. .......................... 257/192; 257/194; 257/280; 257/282; 257/289

[58] Field of Search ................................... 257/192, 194, 257/280, 282, 289

[56] References Cited

PUBLICATIONS

Asbeck et al., "Piezoelectric Effects in GaAs FET's and Their Role in Orientation–Dependent Device Characteristics", *IEEE Transactions on Electron Devices*, vol. ED–31, No. 10, Oct. 1984, pp. 1377–1380.

T. Onodera et al., "Improvement in GaAs MESFET Performance Due to Piezoelectric Effect", IEEE Transactions on Electron Devices, Nov. 1985, vol. ED–32, No. 11, pp. 2314–2318.

*Primary Examiner*—William Mintel
*Attorney, Agent, or Firm*—George C. Chen

[57] ABSTRACT

A semiconductor device (20) is formed on a compound semiconductor substrate (21). The semiconductor device (20) is oriented on the surface (40) of the compound semiconductor substrate (21) such that the physical forces that result from the thermal heating or cooling of the compound semiconductor substrate (21) are essentially equal. This orientation reduces the variability of the drain to source current of the semiconductor device (20) as the semiconductor device (20) is operated at different temperatures.

12 Claims, 2 Drawing Sheets

COMPOUND SEMICONDUCTOR DEVICE HAVING REDUCED TEMPERATURE VARIABILITY

BACKGROUND OF THE INVENTION

The present invention relates, in general, to semiconductor devices, and more particularly, to devices formed in compound semiconductor substrates sensitive to performance variations as a result of changes in operational temperature.

One problem that is common to conventional field effect transistors (FETs) formed in compound semiconductor substrates is that their performance tends to vary with changes in operational temperature. For example, the current flow from a drain region to a source region of the FET can vary as the semiconductor device is heated or cooled. This variation in the performance of the FET is further illustrated in FIG. 1.

FIG. 1 is a graph 10 demonstrating how the performance of a field effect transistor fabricated using conventional processing techniques can vary as the FET is heated and cooled. Graph 10 has an x-axis 11 that represents a voltage potential between a gate structure and a source region of the FET in volts (V). Typical values for this gate to source voltage ($V_{gs}$) can range from about −10 volts to +10 volts depending on the design of the individual FET. Graph 10 also has a y-axis 12 that represents the drain to source current ($I_{ds}$) of the FET in milliamps (mA). A line 13 represents the drain to source current of the conventional FET as the gate to source voltage is varied. As the gate to source voltage is varied, the FET is maintained at room temperature (approximately 25 degrees Celsius (° C.)). Lines 14 and 15 represent the drain to source current of the same FET over the same voltage range, but at an ambient temperature of 90° C. and −40° C., respectively.

As shown in graph 10, the drain to source current for the FET at the same gate to source voltage potential can vary significantly depending on the operational temperature. For example, a bracket 16 represents the variance in drain to source current of the FET at a gate to source voltage potential of about −2.6 volts. Such performance variations are unacceptable as FETs are commonly placed in environments where the operational temperature can vary significantly.

One traditional technique for addressing this problem is to add temperature compensating diodes to the field effect transistor. These temperature compensating diodes are either integrated into the semiconductor device or are discrete components that are added to the semiconductor device after fabrication. The addition of the temperature compensating diodes can complicate the design of the FETs or increase the surface area of the devices to make room for the diodes. Additionally, if the temperature compensating diodes are discrete components, then they complicate the manufacturing process and add a reliability concern for the FET. Consequently, the use of temperature compensating diodes increases the manufacturing cost of field effect transistors formed in compound semiconductor substrates.

Accordingly, a need exists to provide a semiconductor device formed in a compound semiconductor substrate that is more tolerant of variations in operational temperature. It would also be advantageous if the semiconductor device did not require the use of temperature compensating diodes, and it would be advantageous if the semiconductor device could be formed within less surface area than conventional FETs.

Figure 1:
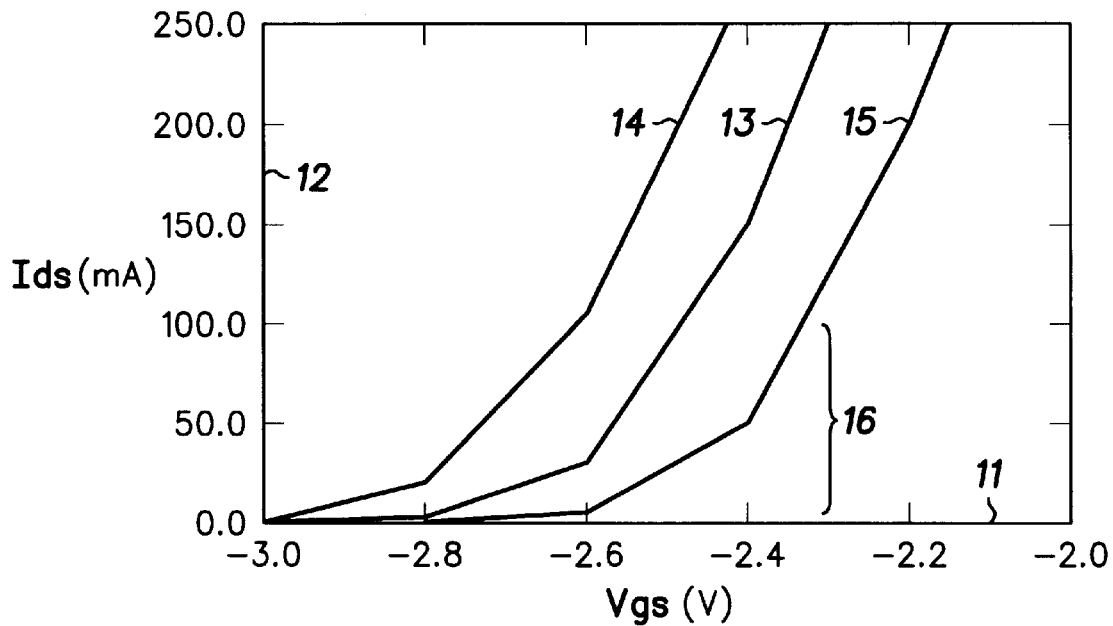
FIG. 1 is a graph representing the drain to source current of a conventional field effect transistor.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Figure 2:
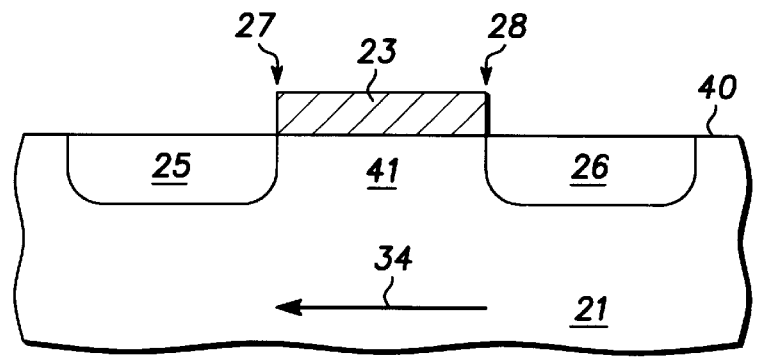
FIG. 2 is an enlarged cross-sectional view of a semiconductor device oriented on a semiconductor substrate in accordance with the present invention.

FIG. 2 is an enlarged cross-sectional view of a semiconductor device 20 formed on a compound semiconductor substrate 21. Preferably, compound semiconductor substrate 21 is a gallium arsenide substrate, but it should be also understood that compound semiconductor substrate 21 can be made from other materials such as silicon carbide, alloys of compound semiconductors such as aluminum-gallium-arsenide, or similar materials.

Semiconductor device 20 has a gate structure 23 on a surface 40 of semiconductor substrate 21 that is formed from a conductive material. Semiconductor device 20 also has a drain region 26 and a source region 25, which are adjacent to edges 28 and 27 of gate structure 23, respectively. Drain region 26 and source region 25 are formed by doping portion of compound semiconductor substrate 21 using conventional techniques. In one method of forming drain region 26 and source region 25, gate structure 23 is used as a hard mask so the location of drain region 26 and source region 25 is dependent on the position of edges 27 and 28. Gate structure 23 is used to control a current flow from drain region 26 to source region 25 across a channel region 41. The direction of the current flow across channel region 41 is indicated in FIG. 2 by an arrow 34. It should be understood that the direction of the current flow across channel region 41 is the average or net sum of all currents passing through channel region 41 when semiconductor device 20 is in operation.

Unlike conventional silicon substrates, compound semiconductor substrates are piezoelectric. This means that the electrical properties of compound semiconductor substrates can vary when physical forces are applied to the compound semiconductor substrate. For example, when a compound semiconductor substrate is heated or cooled, there are resulting stresses and strains from thermal expansion and contraction. These stresses are due to mismatches in thermal expansion characteristics of the compound semiconductor substrate and the overlying films that make up a semiconductor device (i.e. metallization and insulating layers). The physical forces create electric fields in the electrically active portions of a semiconductor device, which affect the magnitude of current flows within the compound semiconductor substrate as illustrated in FIG. 1.

Figure 3:
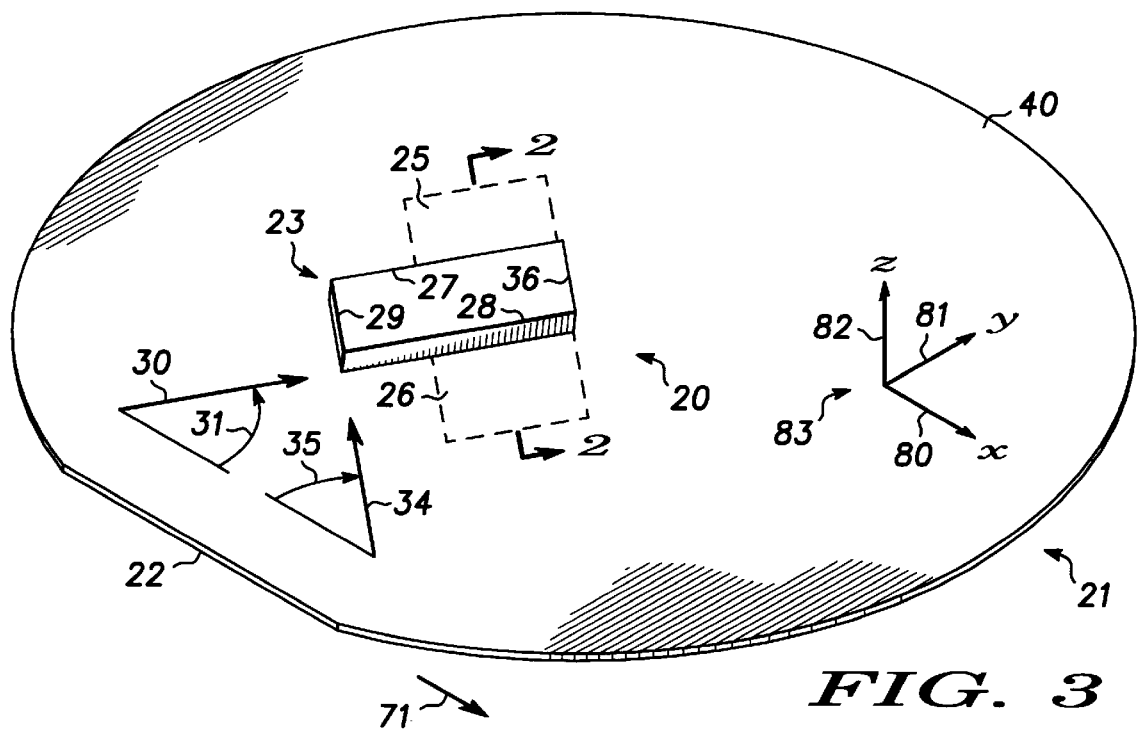
FIG. 3 is an enlarged isometric view of the semiconductor device of FIG. 2.

FIG. 3 is an enlarged isometric view of semiconductor device 20 oriented on compound semiconductor substrate 21 in accordance with the present invention. Sectional lines 2—2 are used to represent the location of the cross-sectional view of FIG. 2. Compound semiconductor substrate 21 has a crystallographic orientation such as a (100) or a (110) crystal orientation. Surface 40 of semiconductor substrate 21 represents a plane defining the orientation of compound semiconductor substrate 21. By orienting semiconductor device 20 relative to the crystallographic orientation of compound semiconductor substrate 21, the performance variation due to the piezoelectric nature of compound semiconductor substrate 21 can be reduced. The example that follows is just one possible embodiment of the present invention and it should also be understood that the present invention is not intended to be limited only to FET structures. The performance variation of other semiconductor devices can be addressed by the present invention.

The crystallographic orientation of a substrate is the specific orientation of the plane defined by surface of the substrate. It should also be understood that the (100) orientation is a cubic orientation and that there are six equivalent planes that are named solely based on an arbitrary reference point. In other words, the (100), (010), and (001) orientations are all equivalent and are sometimes referred to as the {100} orientation.

As mentioned above, many compound semiconductor substrates are piezoelectric. It has been discovered that the physical forces that are created from thermal expansion and contraction can be compensated for by optimizing the orientation of semiconductor devices relative to the crystallographic orientation of the underlying compound semiconductor substrate.

More specifically, as compound semiconductor substrate 21 is heated or cooled, forces are applied to compound semiconductor substrate 21 as a result of the mismatch in the thermal expansion coefficients of the materials used to fabricate semiconductor device 20. These forces can be broken down and represented as net forces in the x-, y-, and z-directions. By orienting semiconductor device 20 relative to these forces, the electrical effects due to the piezoelectric nature of compound semiconductor substrate 21 can be minimized.

In the example suggested above, compound semiconductor substrate 21 has a (100) orientation, which means that the direction essentially perpendicular to surface 40 of compound semiconductor substrate 21 is in the [100] direction. A reference axis 83 is used to show the relative directions in the x-, y-, and z-directions. These are indicated in FIG. 3 by an x-axis 80, a y-axis 81, and a z-axis 82. In this example, x-axis 80 is in the [0$\underline{1}$1] direction, y-axis 81 is in the [011], and z-axis 82 is in the [100]. In the present invention, the symbol '$\underline{1}$' is used to represent the symbol used by those skilled in the art that is best described as a '1' with a bar over it. In other words, the direction [$\underline{1}$00] is used to indicate the direction that is opposite of the [100] direction.

According to the present invention, semiconductor device 20 is preferably oriented at a 45 degree angle relative to the x- and y-directions of the crystallographic orientations of compound semiconductor substrate 21. As shown in FIG. 3, gate structure 23 has a first end 29 and a second end 36, and edges 27 and 28 running between ends 29 and 36. An arrow 30 is used to represent a direction of edges 27 and 28 and also represents the relative orientation of semiconductor device 20 on compound semiconductor substrate 21. In this example, arrow 30 is in the [011] direction.

Compound semiconductor substrate 21 can also have a flat 22 that is used to indicate the crystallographic orientation of compound semiconductor substrate 21. If compound semiconductor substrate 21 has a (100) orientation, then flat 22 is along the x-direction. The direction of flat 22 is indicated in FIG. 3 by an arrow 71. In the preferred embodiment, the orientation of semiconductor device 20 is about 45 degrees relative to flat 22. This angle is indicated in FIG. 3 as an angle 31. It should also be understood that the presence of a flat is optional and should not be considered a limitation of the present invention.

Another way of describing the relative placement of semiconductor device 20 on compound semiconductor substrate 21 is to describe the direction of a current flow through semiconductor device 20 relative to the crystallographic orientation of compound semiconductor substrate 21. As mentioned earlier, semiconductor device 20 can be a field effect transistor (FET) in which case a current flows from drain region 26 to source region 25 when semiconductor device 20 is in operation. The approximate direction of this current flow is indicated in FIG. 3 with arrow 34 (see FIG. 2), which is in the [0$\underline{1}$0] direction. Preferably, the direction of the current flow is about 45 degrees relative to the orientation of compound semiconductor substrate 21. This angle is shown in FIG. 3 as an angle 35 relative to the direction (arrow 71) of flat 22. It should also be noted that arrow 30 is substantially perpendicular to arrow 34 since gate structure 23 is rectangular in shape as shown in FIG. 3.

In this example, semiconductor device 20 is oriented so the electric fields that result from the forces of thermal expansion and contraction compensate each other. As a result, the net force that is placed on the electrically active portions of semiconductor device 20 is reduced. This in turn reduces the impact on carriers in the electrically active portions of semiconductor device 20. Consequently, the performance variation of semiconductor device 20 across different operating temperatures is improved.

The example provided above is meant to be only one embodiment of the present invention. It is also possible to compensate for the thermal effects due to the piezoelectric nature of compound semiconductor devices by orienting a semiconductor device in other directions. If compound semiconductor substrate 21 is formed such that it has other crystallographic orientations, the following directions for arrow 30 or arrow 34 will also compensate for the piezoelectric effects of compound semiconductor substrate 21. These alternative directions are the [010], [0$\underline{1}$0], [001], [00$\underline{1}$], [100], and the [$\underline{1}$00] directions.

If semiconductor device 20 is oriented in any of these directions, the performance variations that result from the physical forces due to thermal expansion can be reduced. Depending on the magnitudes of the stress and strain forces placed on compound semiconductor substrate 21 and the piezoelectric properties of compound semiconductor substrate 21, the optimal direction for a particular semiconductor device may vary by about −10° to +10° from any of these directions.

Figure 4:
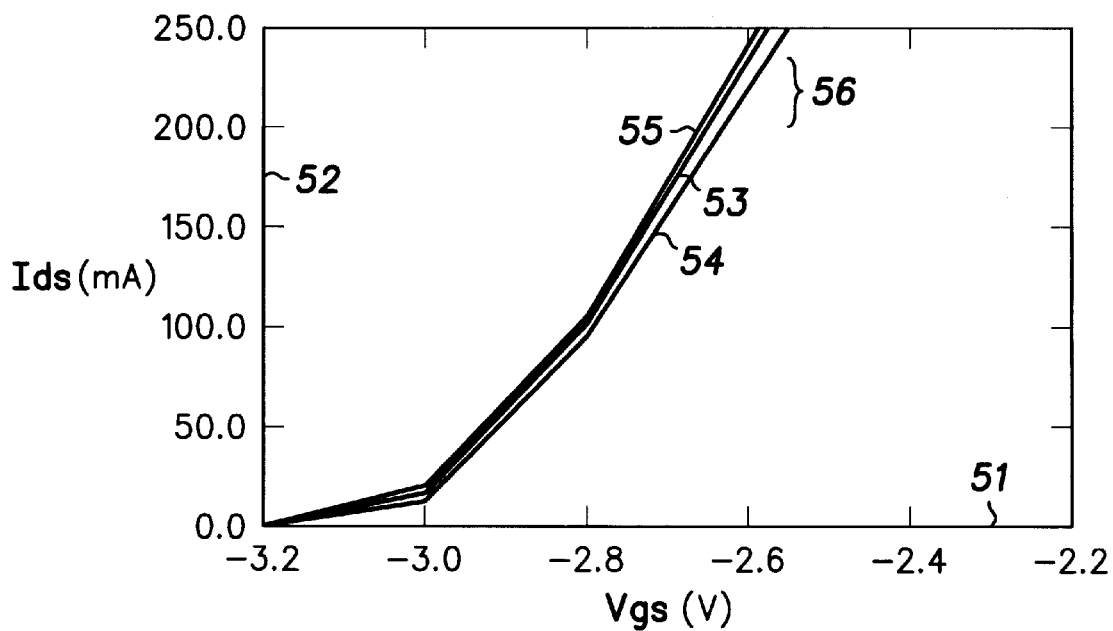
FIG. 4 is a graph representing the performance of the semiconductor device in accordance with the present invention.

FIG. 4 is a graph 50 of a semiconductor device that is oriented on a compound semiconductor substrate in one of the directions described above. Graph 50 has an x-axis 51 that represents a voltage potential between a gate structure and a source region of the semiconductor device in volts (V). Graph 50 also has a y-axis 52 that represents the drain to source current of the semiconductor device in milliamps (mA). A line 53 represents the drain to source current of the semiconductor device as the gate to source voltage is varied. As the gate to source voltage is varied, the semiconductor device is maintained at room temperature, approximately 25° C. Lines 54 and 55 represent the drain to source current of the same semiconductor device over the same voltage range, but at an operational temperature of 90° C. and −40° C., respectively.

A bracket 56 is shown in FIG. 4 to indicate how the drain to source current of the semiconductor device varies across the different operational temperatures. A semiconductor device oriented as described in the example above can have a significant reduction in the performance variation when compared to previously known devices. As shown in FIG. 4, the drain to source current varies less than 5 percent when the semiconductor device is operated over a temperature range of about 75° C. Compared to the variability of a conventional device (see FIG. 1), a semiconductor device oriented in accordance with the present invention is less sensitive to variations in operational temperature. This means that the semiconductor device performs more consistently and more predictably than conventional devices.

In addition to an improvement in thermal performance variations, a semiconductor device oriented on a compound semiconductor substrate in accordance with the present invention does not require the use of temperature compensating diodes. As a result, field effect transistors can be formed in less surface area since there is no need to form the additional diodes. The present invention also obviates the need to add discrete temperature compensating diodes to the semiconductor device. Therefore, the present invention provides a method for reducing the temperature sensitivity of a semiconductor device as well as a method for reducing the manufacturing cost of the semiconductor device.

We claim:

1. A semiconductor device comprising:

a compound semiconductor substrate having a surface;

a gate structure overlying the surface of the compound semiconductor substrate, wherein the gate structure has a first edge and a second edge, and the first edge is along a first direction;

a source region disposed in the compound semiconductor substrate and adjacent to the first edge of the gate structure;

a drain region disposed in the compound semiconductor substrate and adjacent to the second edge of the gate structure; and wherein the gate structure is oriented on the surface of the compound semiconductor substrate such that the first direction is substantially in one of the [0$\bar{1}$0], [100] and [$\bar{1}$00] directions relative to the compound semiconductor substrate.

2. The semiconductor device of claim 1 wherein the compound semiconductor substrate has a flat in a second direction and the second direction is at an angle ranging from about 35 degrees to 55 degrees relative to the first direction.

3. The semiconductor device of claim 1 wherein the first edge of the gate structure is aligned to the compound semiconductor substrate such that forces due to thermal expansion in an x-direction compensate for forces due to thermal expansion in a y-direction.

4. The semiconductor device of claim 3 wherein the compound semiconductor substrate has a crystallographic orientation of (100).

5. The semiconductor device of claim 3 wherein a first voltage potential between the gate structure and the compound semiconductor substrate results in a current between the drain region and the source region that has a first value when the compound semiconductor substrate is at a first temperature, the current has a second value when the compound semiconductor substrate is at a second temperature, and the second value is within about 5 percent of the first value when the second temperature is at least 75° C. greater than the first temperature.

6. The semiconductor device of claim 5 wherein there is a voltage potential difference of about 3 volts between the gate structure and the source region.

7. A semiconductor device comprising:

a compound semiconductor substrate having a surface, wherein the surface of the compound semiconductor substrate has a crystallographic orientation;

a first doped region disposed in the compound semiconductor substrate;

a second doped region disposed in the compound semiconductor substrate and separated from the first doped region by a portion of the compound semiconductor substrate to provide a channel region, wherein a current flows in a first direction across the channel region when a voltage potential is placed between the first doped region and the second doped region; and wherein the current has a first value when the compound semiconductor substrate is at a first temperature, the current has a second value when the compound semiconductor substrate is at a second temperature, and the second value is within about 5 percent of the first value when the second temperature is at least 75° C. greater than the first temperature.

8. The semiconductor device of claim 7 further comprising a gate structure overlying the channel region, wherein the first value and the second value of the current are measured when a voltage potential is placed between the gate structure and the compound semiconductor substrate.

9. The semiconductor device of claim 7 wherein the compound semiconductor substrate has a flat in a second direction that is substantially at an angle of about 45 degrees relative to the first direction.

10. The semiconductor device of claim 7 wherein the compound semiconductor substrate comprises gallium and arsenic.

11. The semiconductor device of claim 10 wherein the compound semiconductor substrate has a crystallographic orientation of (100).

12. A semiconductor device comprising:

a compound semiconductor substrate having a surface;

a gate structure overlying the surface of the compound semiconductor substrate, wherein the gate structure has a first edge and a second edge, and the first edge is along a first direction;

a source region disposed in the compound semiconductor substrate and adjacent to the first edge of the gate structure;

a drain region disposed in the compound semiconductor substrate and adjacent to the second edge of the gate structure; and wherein the gate structure is oriented on the surface of the compound semiconductor substrate such that the first direction is substantially in one of the [0$\bar{1}$0], [00$\bar{1}$], [100], and [$\bar{1}$00] directions relative to the compound semiconductor substrate.

* * * * *